(12) United States Patent
Okada

(10) Patent No.: US 9,263,318 B2
(45) Date of Patent: Feb. 16, 2016

(54) METHOD OF FORMING A LAMINATED SEMICONDUCTOR FILM

(71) Applicant: TOKYO ELECTRON LIMITED, Tokyo (JP)

(72) Inventor: Mitsuhiro Okada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 280 days.

(21) Appl. No.: 13/832,453

(22) Filed: Mar. 15, 2013

(65) Prior Publication Data

US 2013/0244399 A1 Sep. 19, 2013

(30) Foreign Application Priority Data

Mar. 15, 2012 (JP) ................. 2012-058948

(51) Int. Cl.
*H01L 21/20* (2006.01)
*H01L 21/762* (2006.01)
*H01L 21/02* (2006.01)
*H01L 21/67* (2006.01)

(52) U.S. Cl.
CPC ...... *H01L 21/76251* (2013.01); *H01L 21/0245* (2013.01); *H01L 21/0262* (2013.01); *H01L 21/02381* (2013.01); *H01L 21/02488* (2013.01); *H01L 21/02507* (2013.01); *H01L 21/02532* (2013.01); *H01L 21/02579* (2013.01); *H01L 21/02592* (2013.01); *H01L 21/02667* (2013.01); *H01L 21/67109* (2013.01)

(58) Field of Classification Search
CPC .............. H01L 21/76251; H01L 21/67109; H01L 21/0262; H01L 21/0245
USPC .................................. 438/493, 495
See application file for complete search history.

(56) References Cited

U.S. PATENT DOCUMENTS

2010/0326507 A1* 12/2010 Matsumoto et al. .......... 136/255
2011/0195580 A1* 8/2011 Okada et al. ................. 438/763

FOREIGN PATENT DOCUMENTS

| JP | 06275538 A | 9/1994 |
|---|---|---|
| JP | 2010-225694 A | 10/2010 |
| JP | 2011249764 A | 12/2011 |
| KR | 10-2009-0033788 A | 9/1994 |
| KR | 10-2009-0037468 A | 12/2011 |
| WO | 2007040183 A1 | 4/2007 |

* cited by examiner

*Primary Examiner* — Bradley K Smith
(74) *Attorney, Agent, or Firm* — Nath, Goldberg & Meyer; Jerald L. Meyer

(57) ABSTRACT

According to some embodiments of the present disclosures, a method of forming a laminated semiconductor film is constituted by alternately laminating first and second semiconductor films on an underlying film of each of a plurality of substrates to be processed. The method includes performing a first operation of forming the first semiconductor film and a second operation of forming the second semiconductor film until a predetermined number of laminated films are obtained. In the method, a film forming temperature in the first operation and a film forming temperature in the second operation are set to be equal to each other, and temperatures between the first and second operations are set to be constant.

15 Claims, 9 Drawing Sheets

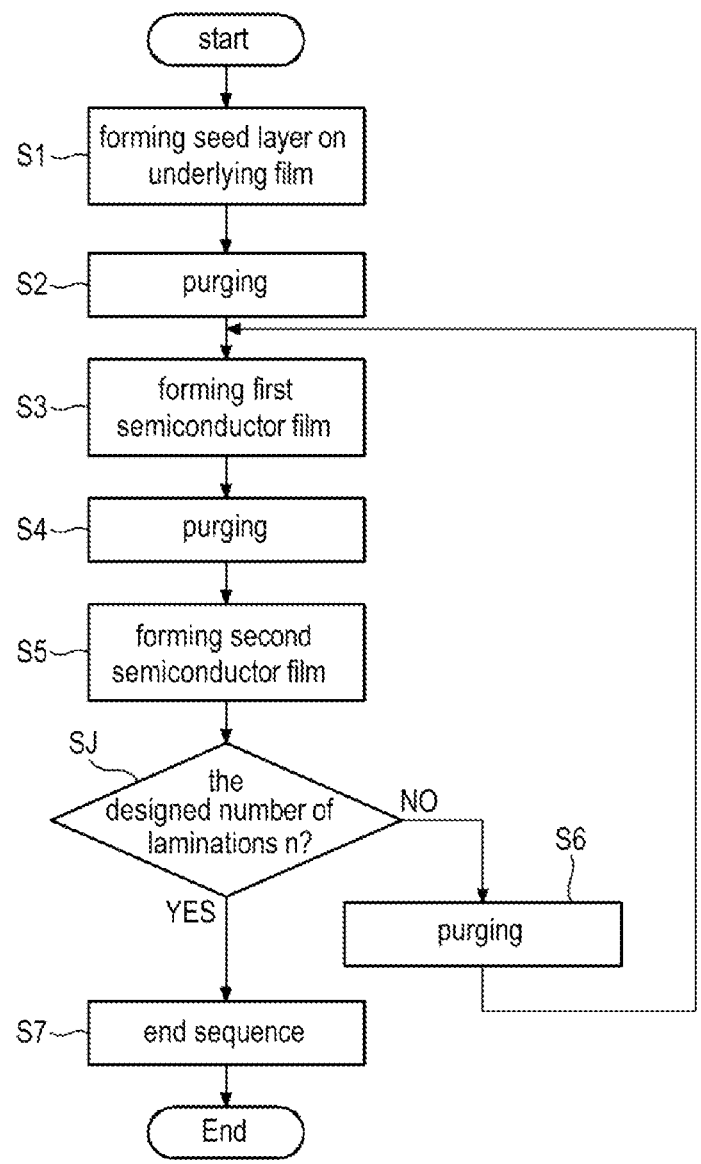

METHOD OF FORMING A LAMINATED SEMICONDUCTOR FILM

CROSS-REFERENCE TO RELATED APPLICATION

This application claims the benefit of Japanese Patent Application No. 2012-058948, filed on Mar. 15, 2012, in the Japan Patent Office, the disclosure of which is incorporated herein in its entirety by reference.

TECHNICAL FIELD

The present disclosure relates to a method of forming a laminated semiconductor film.

BACKGROUND

In recent years, a semiconductor integrated circuit device having high integration with elements such as a transistor has been developed. In such device, a memory cell and others are laminated upward on a surface of a semiconductor wafer to produce a three-dimensional semiconductor integrated circuit device. As an example, there is a conventional technique which laminates a non-doped silicon film and a doped silicon film in multiple layers such that the memory cell becomes three-dimensional.

In such a conventional technique, if the elements become three-dimensional, the number of laminations of a laminated structure in the semiconductor integrated circuit device increases as compared with the existing semiconductor integrated circuit device which mainly includes planer-type elements.

In these circumstances, there are two major problems to be solved in the field of a semiconductor manufacturing process.

First, in the semiconductor manufacturing process, it is difficult to maintain and further enhance a good throughput. For example, the semiconductor integrated circuit device having three-dimensional integrated elements can be manufactured only by repeatedly performing processes of forming different films multiple times. In this case, the time required to manufacture one semiconductor integrated circuit device having three-dimensional elements becomes much longer than that of the semiconductor integrated circuit device integrating the planer-type elements.

Further, it is difficult to maintain a good surface roughness up to an upper layer of the laminated structure. If the number of film laminations increases, slight "disturbances" on a lower layer may affect its surface roughness, which will be amplified as it goes upward. As such, the surface roughness is likely to be more uneven towards the upper layer.

SUMMARY

Some embodiments of the present disclosure take the above circumstances into consideration and provide to a method of forming a laminated semiconductor film, which is capable of maintaining or further enhancing a good throughput, even if processes of forming different films are repeatedly performed.

Further, some embodiments of the present disclosure provide to a method of forming a laminated semiconductor film, which is capable of maintaining a good surface roughness up to an upper layer, even if processes of forming different films are repeatedly performed.

According to one embodiment of the present disclosures, a method of forming a laminated semiconductor film is constituted by alternately laminating first and second semiconductor films on an underlying film of each of a plurality of substrates to be processed. The method includes performing a first operation of forming the first semiconductor film and a second operation of forming the second semiconductor film until a predetermined number of laminated films are obtained. In the method, a film forming temperature in the first operation and a film forming temperature in the second operation are set to be equal to each other, and temperatures between the first and second operations are set to be constant.

According to another embodiment of the present disclosure, a method of forming a laminated semiconductor film is constituted by alternately laminating first and second semiconductor films on an underlying film of each of a plurality of substrates to be processed. The method includes performing a first operation of forming the first semiconductor film and a second operation of forming the second semiconductor film until a predetermined number of laminated films are obtained. In the method, gas containing a material which is desorbed from the first and second semiconductor films during the formation thereof is employed as a purge gas to be used between the first and second operations.

According to another embodiment of the present disclosure, a method of forming a laminated semiconductor film is constituted by alternately laminating first and second semiconductor films on an underlying film of each of a plurality of substrates to be processed. The method includes forming the laminated semiconductor film by performing a first operation of forming the first semiconductor film and a second operation of forming the second semiconductor film until a predetermined number of laminated films are obtained, and forming a seed layer on the underlying film of the substrate to be processed prior to the formation of the laminated semiconductor film.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flow chart showing an example of a method of forming a laminated semiconductor film according to one embodiment of the present disclosure.

DETAILED DESCRIPTION

Figure 2A:
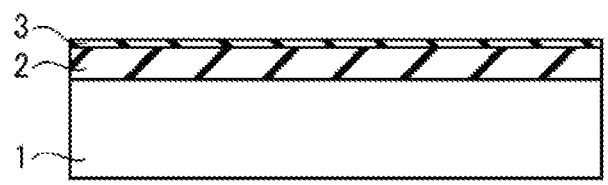
FIGS. 2A to 2D are cross sectional views showing main operations of the film forming method according to one embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments according to the present disclosure will be described in detail with reference to the accompanying drawings. In the drawings, like reference numerals denote like elements.

<Film Forming Method>

FIG. 1 is a flow chart showing an example of a method of forming a laminated semiconductor thin film according to one embodiment of the present disclosure, and FIGS. 2A to 2D are cross sectional views showing main operations of the film forming method.

This embodiment is directed to a method of forming a laminated semiconductor film, which alternatively laminates first and second semiconductor films on an underlying film. In this embodiment, a silicon oxide ($SiO_2$) film 2 formed on a silicon substrate (silicon wafer=single crystalline silicon) 1 is used as an example of the underlying film (see FIG. 2A). The underlying film is not limited to the silicon oxide film 2. For example, an insulation film such as a silicon nitride film may be used as the underlying film.

First, the silicon substrate, 1 on which the silicon oxide film 2 is formed, is received in a processing chamber of a film forming apparatus (which will be described later). Subsequently, as shown in operation of S1 of FIG. 1 and FIG. 2A, a seed layer is formed on a surface of the silicon oxide film 2 as the underlying film. In this embodiment, a non-doped silicon seed layer 3 as the seed layer is formed by absorbing silicon on the surface of the silicon oxide film 2. Further, a disilane ($Si_2H_6$) gas is used as an absorption treatment gas to absorb the silicon on the surface of the silicon oxide film 2. The silicon seed layer 3 may be formed, e.g., within a thickness range of a monoatomic layer to several atomic layers so that the silicon is absorbed on the surface of the silicon oxide film 2. A dimension of the thickness may range from 0.5 nm to 5 nm.

An example of process conditions when the silicon seed layer 3 is formed, is as follows:
Disilane Flow Rate: 350 sccm
Process time: 10 min
Process Temperature: 500 degrees C.
Process Pressure: 133 Pa (1 Torr)

Thereafter, as shown in operation S2 of FIG. 1, the interior of the processing chamber is purged. In this embodiment, a hydrogen ($H_2$) gas is used as a purge gas.

An example of purge conditions of the operation S2 are as follows:
Hydrogen Flow Rate: 1000 sccm
Purge time: 16 min
Temperature: 500 degrees C.
Pressure: 93.3 Pa (0.7 Torr)

Figure 2B:

Subsequently, as shown in operation S3 of FIG. 1 and FIG. 2B, a boron-doped amorphous silicon film (hereinafter, referred to as "B-α silicon film") 4 as a first semiconductor film is formed on the silicon seed layer 3. In this embodiment, a monosilane ($SiH_4$) gas is used as a silicon raw material gas and a boron trichloride ($BCl_3$) gas is used as a dopant gas.

An example of process conditions when the B-α silicon film 4 is formed, is as follows:
Monosilane Flow Rate: 2000 sccm
$BCl_3$ Gas Flow Rate: 1 sccm
Process time: 8.5 min
Process Temperature: 500 degrees C.
Process Pressure: 93.3 Pa (0.7 Torr)

Under these process conditions, for example, the B-α silicon film 4 having a thickness of about 40 nm is formed.

Thereafter, as shown in operation S4 of FIG. 1, the interior of the processing chamber is purged. In this embodiment, the hydrogen ($H_2$) gas is used as the purge gas.

An example of purge conditions of the operation S4 are as follows:
Hydrogen Flow Rate: 1000 sccm
Purge time: 2 min
Temperature: 500 degrees C.
Pressure: 53.3 Pa (0.4 Torr)

Figure 2C:
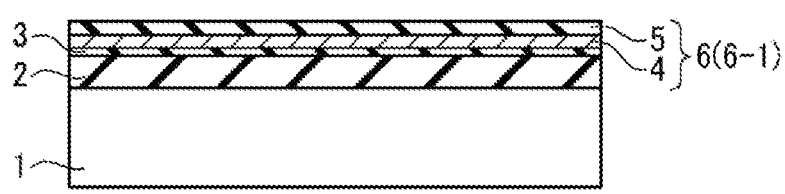
Figure 2D:
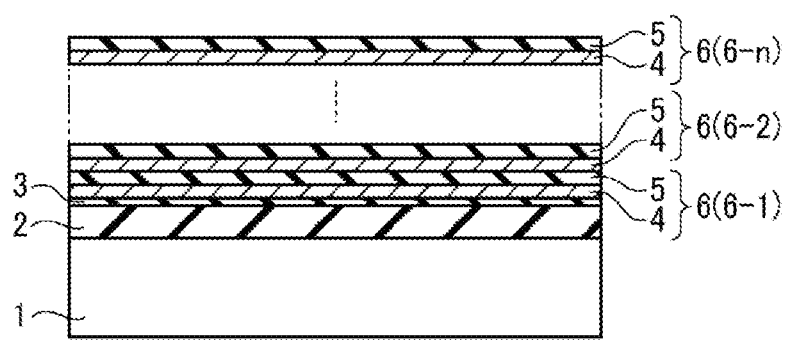

Subsequently, as shown in operation S5 of FIG. 1 and FIG. 2C, a non-doped amorphous silicon film (hereinafter, referred to as "α silicon film") 5 as a second semiconductor film is formed on the B-α silicon film 4. In this embodiment, a monosilane ($SiH_4$) gas is used as the silicon raw material gas.

An example of process conditions when the α silicon film 5 is formed, is as follows:
Monosilane Flow Rate: 1000 sccm
Process time: 50 min
Process Temperature: 500 degrees C.
Process Pressure: 53.3 Pa (0.4 Torr)

Under these process conditions, for example, the α silicon film 5 having a thickness of about 40 nm is formed on the B-α silicon film 4 so that a first laminated structure 6-1 which is constituted by a set of the B-α silicon film 4 and the α silicon film 5 is formed. Hereinafter, the first laminated structure 6-1, a second laminated structure 6-2, . . . , and an nth laminated structure 6-n (which are to be subsequently formed) are sometimes simply referred to as a "laminated structure 6."

Next, as shown in operation SJ of FIG. 1, whether the number of laminations of the laminated structure 6 reached a predetermined number n is determined. If it is determined that the number of laminations of the laminated structure 6 have not reached the predetermined number (NO in the operation SJ), the control process performs operation S6 where the interior of the processing chamber is purged. In some embodiments, the hydrogen ($H_2$) gas is used as the purge gas similarly to the operations S2 and S4.

An example of purge conditions of the operation S6 are as follows:
Hydrogen Flow Rate: 1000 sccm
Purge time: 2 min
Temperature: 500 degrees C.
Pressure: 93.3 Pa (0.7 Torr)

Subsequently, the control process returns to the operation S3 where the B-α silicon film 4 is formed on the α silicon film 5. Next, the control process moves on to the operation S4 of purging the interior of the processing chamber, and subsequently, to the operation S5 of forming the α silicon film 5 on the B-α silicon film 4. In this way, the second laminated structure 6-2 is formed. Thereafter, the operation SJ is performed. The operations S3 to S6 and SJ are repeatedly performed until the number of laminations of the laminated structure 6 reaches the predetermined number n.

If it is determined that the number of laminations of the laminated structure 6 reaches the predetermined number n (YES in the operation SJ), the control process performs operation S7 where an end sequence is performed. In the end sequence, a temperature of the silicon substrate 1 is decreased to a temperature at which the silicon substrate 1 can be transferred outward, or an internal atmosphere of the processing chamber is displaced into an atmosphere (e.g., the air) in which the silicon substrate 1 can be transferred outward. Upon completion of the end sequence, the silicon substrate 1 on which n laminated structures 6-1 to 6-n are formed is carried out of the processing chamber. At this time, the method of forming the laminated semiconductor film is terminated.

In the aforementioned embodiment, process temperatures in the operations S1 to S6 of FIG. 1 are set to be equal to each other. Further, temperatures between a series of the operations S1 to S6 are set to be constant. With this configuration, it is possible to reduce the time required for a change in temperature in the purge processes of the operations S2, S4 and S6. As a result, a total of process time is shortened compared to the case where the process temperature is changed in the purge processes of the operations S2, S4 and S6.

Figure 3:
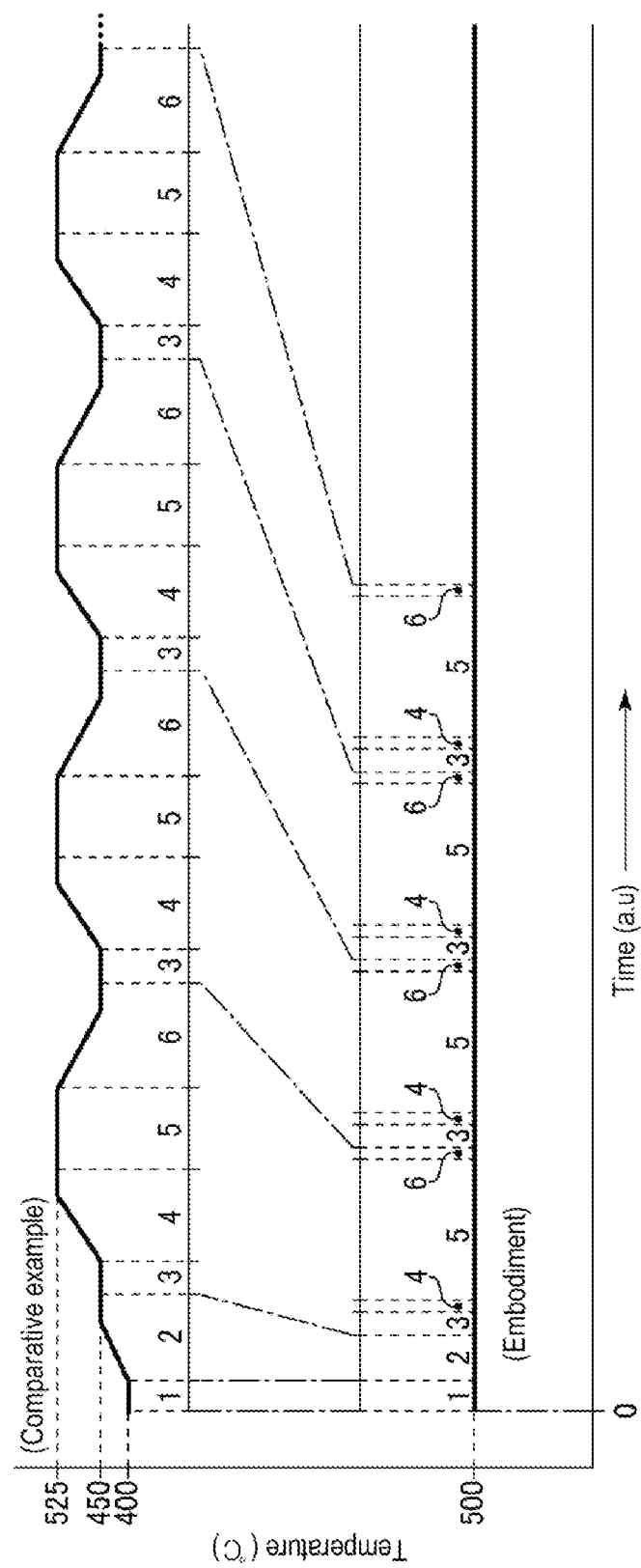
FIG. 3 is a graph showing the relationship between each of the operations and a temperature on a timeline.

FIG. 3 is a graph showing the relationship between each of the operations and a temperature on a timeline, with a temperature as the vertical axis and a time as the horizontal axis. In FIG. 3, the time travels in a direction indicated by an arrow, and a unit of the time is indicated by a certain unit (a.u.). Further, numerical numbers "1, 2, 3, 4, 5, 6" shown in FIG. 3 correspond to the operations S1, S2, S3, S4, S5 and S6, respectively.

In a comparative example shown in FIG. 3, an absorption temperature in the operation S1 is set to 400 degrees C., and film forming temperatures in the operations S3 and S5 are set to 450 degrees C. and 525 degrees C., respectively. A temperature in each of the purge processes of the operations S2, S4 and S6 may be changed up or down. In this comparative example, the purge processes of the operations S2, S4 and S6 require the time required for a change in temperature and the time required for a stabilization of temperature separately. This prolongs the process time of each of the operations S2, S4 and S6.

Meanwhile, in this embodiment, the process times for the purge processes of the operations S2, S4 and S6 do not include the time required for a change in temperature and the time required for a stabilization of temperature. This allows the process times of the operations S2, S4 and S6 to be reduced when compared with the comparative example. Specifically, it was found that, as a result of the above purge processes, the operation S2 reduced the process time to about 47% (as an example, 30 min→16 min), the operation S4 reduced the process time to about 94% (as an example, 32 min→2 min), and the operation S6 reduced the process time to about 95% (as an example, 37 min→2 min), when compared with the comparative example.

Further, in this embodiment, the absorption temperature in the operation S1, and the film forming temperatures of the operations S3 and S5 may be fixed to 500 degrees C. The absorption temperature in the operation S1 is higher than that in the comparative example, while the process time is identical to that in the comparative example.

In the operation S3 according to this embodiment, the film forming temperature may be 500 degrees C., which is higher than that of the comparative example, i.e., 450 degrees C. This increases a film forming rate of the B-α silicon film 4, which shortens the process time of the operation S3 to about 36% (as an example, 13.3 min→8.5 min) when compared with the comparative example.

Further, in the operation S5 according to this embodiment, the film forming temperature may be 500 degrees C., which is lower than that of the comparative example, i.e., 525 degrees C. This decreases a film forming rate of the α silicon film 5, which prolongs the process time of the operation S5. The process time of the operation S5 is increased to about 83% (as an example, 27.3 min→50 min) when compared with the comparative example.

As described above, keeping the process temperature in each of the operations S1 to S6 at the constant temperature causes a prolonged process time in some operations, but drastically shortens the process times of the operations S2, S4 and S6. As an example, it was found that the overall process time of the operation S1 to S6 is decreased to about 41% when compared with the comparative example. In addition, it was found that the overall process time of the operations S3 to S6 which are performed in an iterative cycle, is decreased to about 43% when compared with the comparative example. Particularly, it was found that the process times of the operations S4 and S6 which are performed in an iterative cycle, are further decreased as the number of laminations increases.

In view of the foregoing, it was assumed that the time required for the end sequence after the laminated semiconductor films are formed by the predetermined number n is not changed in both the comparative example and this embodiment, and an improvement likelihood rate in throughput when 125 sheets of semiconductor wafers are simultaneously processed is set to 100% for the comparative example. Then, it was found that the improvement likelihood rate of this embodiment manifests about 167%, which results in an increase in throughput of about 67% (e.g., 2.72 sheets per hour→4.54 sheets per hour).

As described above, according to this embodiment, it is possible to maintain or enhance a good throughput, even if processes of forming different films are repeatedly performed, with a method for forming a laminated semiconductor film in which the film forming temperature of each of the operations S1 to S6 is fixed and temperatures between a series of the operations S1 to S6 are maintained at a constant temperature.

Further, according to some embodiments, various approaches may be designed to maintain a good surface roughness up to an upper layer, even if the processes of forming different films are repeatedly performed. The following is a description of the various approaches.

<First Approach>

The first approach is to use gas containing a material which is desorbed from the B-α silicon film 4 and the α silicon film 5 during the course of a film formation, as the purge gas to be used in the purge processes of the operations S2, S4 and S6.

In some embodiments, the silicon raw material gas used in the B-α silicon film 4 and the α silicon film 5 may be a monosilane gas. For example, when the B-α silicon film 4 and the α silicon film 5 are formed using a silane-based gas such as the monosilane gas, the hydrogen is coupled with a dangling bond of the silicon to form a Si—H bond. The B-α silicon film 4 and the α silicon film 5 having the Si—H bond are known to have a good film quality.

However, during the film forming processes (the operations S3 and S5) or the purge processes (the operations S4 and S6) in a film forming sequence, the heat is always applied to the silicon substrate 1. This breaks the Si—H bond, which may cause a slight hydrogen desorption. Although such a hydrogen desorption causes the slight amount of desorption, it only entails a slight deterioration in surface roughness accuracy when compared with the B-α silicon film 4 and the α silicon film 5, in which the hydrogen desorption does not occur. In addition, the hydrogen desorption causes a crystallization of a film. Such a crystallization allows the B-α silicon film 4 and the α silicon film 5 to be replaced from an amorphous state into a polycrystalline state. A film of the polycrystalline state has a lower surface roughness accuracy than that of a film of the amorphous state.

The slight deterioration in the surface roughness accuracy as described above may fall within an allowable range for a single layer. However, in this embodiment, the operation of forming the B-α silicon film 4 and the operation of forming the α silicon film 5 are performed in a plurality of, e.g., 24, times, in an iterative cycle, so that a total of 48 layers of a laminated semiconductor film are formed. As such, although the slight deterioration in the surface roughness accuracy in a lower layer falls within a predetermined margin (i.e., the allowable range), it becomes larger upward (i.e., towards an upper layer). Eventually, as it reaches the upper layer, the surface roughness accuracy may not be within the predetermined margin.

In order to maintain the surface roughness accuracy up to the upper layer within the predetermined margin, as described above, the gas containing the material which is desorbed from the B-α silicon film 4 and the α silicon film 5 during the course of the film formation is used as the purge gas to be used in the purge processes of the operations S2, S4 and S6. With this configuration, the material desorbed from the B-α silicon film 4 and the α silicon film 5 can be refilled during the purge processes, which makes is possible to prevent the slight deterioration in the surface roughness accuracy that is caused by the desorption of the material from the B-α silicon film 4 and the α silicon film 5. Specifically, in the case where the film forming process is performed using a hydrogen-containing raw material gas, the hydrogen-containing gas may be used as the purge gas. In the above embodiment, for example, the silane-based gas is used to form the B-α silicon film 4 and the α silicon film 5, and the hydrogen gas is used as the purge gas.

According to the first approach as described above, it is possible to provide a method of forming a laminated semiconductor film, which is capable of maintaining a good surface roughness up to the upper layer, even if the processes of forming different films are repeatedly performed.

Figure 4A:
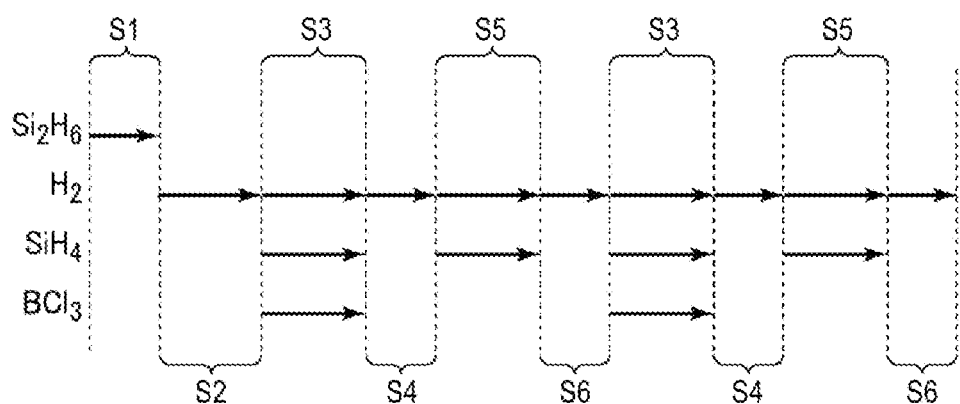
FIGS. 4A and 4B are views showing timings at which gas is supplied.

The following describes a timing at which the gas (e.g., the hydrogen gas) containing the material desorbed from the B-α silicon film 4 and the α silicon film 5 is introduced into the processing chamber. The hydrogen gas may be introduced into the processing chamber only in the purge processes of the operations S2, S4 and S6. Further, as shown in FIG. 4A, the hydrogen gas may be introduced into the processing chamber in each of the operations S2 to S6, or may be continuously introduced into the processing chamber throughout the operations S2 to S6. For example, when the hydrogen gas is introduced into the processing chamber in the operation S3 and S5, it may prevent the hydrogen from being desorbed in the operation S3 of forming the B-α silicon film 4 and the operation S5 of forming the α silicon film 5.

Figure 4B:
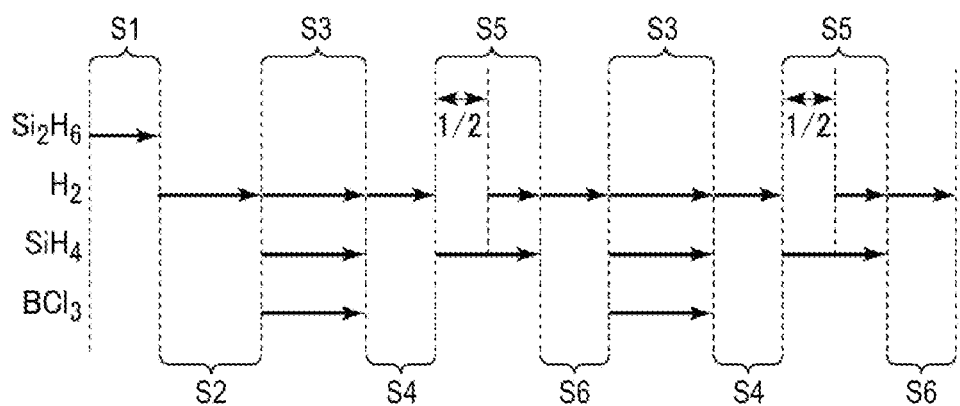

In some embodiments, as shown in FIG. 4B, for example, in the operation S5 of forming the α silicon film 5, the gas (e.g., the hydrogen gas) containing the material desorbed from the α silicon film 5 may be introduced into the processing chamber only at a time interval between the middle and end of the operation S5, without introducing the hydrogen gas into the processing chamber throughout the operation S5. By contrast, when the hydrogen gas is introduced into the processing chamber during the formation of the α silicon film 5, a film forming rate may decrease when compared with the case where the hydrogen gas is not introduced. Thus, in view of the foregoing, the hydrogen gas is introduced into the processing chamber in the time interval between the middle and end of the operation S5, thereby enhancing the film forming rate of the α silicon film 5, when compared with the case where the hydrogen gas is introduced throughout the operation S5.

Further, since the hydrogen gas is introduced in the time interval between the middle and end of the operation S5, it is possible to enhance the film forming rate of the α silicon film 5 while preventing the hydrogen from being desorbed from an exposed surface of the α silicon film 5. For example, the timing at which the introduction of the hydrogen gas is initiated in the middle of the operation S5 may be after the half the whole process time of the operation S5 is performed.

Further, features according to the first approach may be applied to the method of forming the laminated semiconductor film, but is not limited thereto. For example, such features may be applied to a method of forming a semiconductor film as a single-layer.

<Second Approach>

The second approach is to set the film forming temperature of each of the operations S1 to S6 to be less than a crystallization temperature of the B-α silicon film 4 and the α silicon film 5.

During the film formation, the B-α silicon film 4 and the α silicon film 5 are crystallized so that their states are changed from an amorphous state to a polycrystalline state, which causes ultrafine irregularities resulting from the crystallization formed on surfaces of the films. Such ultrafine irregularities entail a slight deterioration in the surface roughness accuracy. Such a slight deterioration in the surface roughness accuracy, which results from the crystallization, may fall within an allowable range for a single layer. However, as described in the first approach, in the laminated semiconductor film, the slight deterioration in the surface roughness accuracy at the lower layer becomes larger towards the upper layer. Further, eventually, the surface roughness accuracy is drastically decreased and may fall outside the predetermined margin.

The slight deterioration in the surface roughness accuracy, which results from the crystallization of the B-α silicon film 4 and the α silicon film 5, can be overcame by setting the film forming temperature of each of the operations S1 to S6 to be less than the crystallization temperature of the B-α silicon film 4 and the α silicon film 5.

According to the second approach as described above, it is possible to provide a method of forming a laminated semiconductor film, which is capable of maintaining a good surface roughness up to the upper layer, even if processes of forming different films are repeatedly performed.

For example, the crystallization temperature may be about 530 degrees C. for the B-α silicon film 4, and about 600 degrees C. for the α silicon film 5.

Therefore, an upper limit of the crystallization temperature of the B-α silicon film 4 and the α silicon film 5 is set to be about 530 degrees C.

For the B-α silicon film 4 and the α silicon film 5, a lower limit of the crystallization temperature may be preferably set to be 480 degrees C. from a practical viewpoint such as the film forming rate, the surface roughness and the like.

Further, although the heat is applied to the B-α silicon film 4 and the α silicon film 5, the crystallization of the B-α silicon film 4 and the α silicon film 5 are slowly progressed. In this regard, in some embodiments, the time required for each of the purge processes of the operation S4 and S6 may be shortened without establishing a change in temperature between a series of the operations S3 and S5. This reduces a total of heat applied to the laminated semiconductor film when compared with the conventional film forming method which changes temperatures in the purge processes.

As described above, by reducing the total of heat to be applied to the laminated semiconductor film, it is possible to prevent the crystallization of the B-α silicon film 4 and the α silicon film 5 in the laminated semiconductor film In addition, the prevention of the crystallization of the B-α silicon film 4 and the α silicon film 5 improves, for example, an etching machinability for a laminated structure film. Such etching process depends on a plane direction. The polycrystalline film includes a myriad of crystallines having various orientations. Assuming that the laminated structure film has the polycrystalline state, when forming a hole which penetrates through the laminated structure film, tiny irregularities which are caused by the orientations of the crystallines, are formed on a lateral surface of the hole. When the hole is filled with a conductive material which constitutes such as a gate electrode, a channel, or an electrical internal wiring, the tiny irregularities formed on the lateral surface of the hole causes a deviation in electrical capacitance of the conductive material. This results in deterioration in performance of the semiconductor integrated circuit device.

In this regards, as described above, according to one embodiment which reduces the total of heat history to prevent the progress of the crystallization caused by the heat; the first approach which controls the crystallization caused by the desorption of the hydrogen; and the second approach which controls the crystallization by performing the film forming process at a temperature less than the crystallization temperature, it is possible to form the laminated structure film while maintaining the amorphous state. Therefore, although the hole which penetrates through the laminated structure film is formed, it is possible to prevent the tiny irregularities from being formed on the lateral surface of the hole. This results in a good etching machinability.

As described above, the prevention of the crystallization of the B-α silicon film 4 and the a silicon film 5 suppresses the fluctuation in electrical capacitance of the conductive material which constitutes such as the gate electrode, the channel or the electrical internal wiring, in a manufactured semiconductor integrated circuit device, which is effective in the manufacture of the semiconductor integrated circuit device having a good performance.

<Third Approach>

The third approach is to form the silicon seed layer 3 on an underlying film of an object to be processed before the formation of the laminated semiconductor film.

The purpose of the formation of the silicon seed layer 3 is to further improve a surface roughness accuracy of a film to be formed in the lowest layer, e.g., the B-α silicon film 4 in this embodiment.

The aforementioned first and second approaches are to prevent the surface roughness accuracy from being deteriorated in the course of the formation of the laminated structure film. In order to maintain a good surface roughness up to the upper layer, there is needed to provide another approach which further increases the surface roughness accuracy of the film formed in the lowest layer. That is, for the laminated structure film, it is hard for a surface roughness accuracy of a film formed on the upper layer to be higher than that of a film formed in the lower layer. In view of the foregoing, it is preferably that the surface roughness accuracy of the film which is formed in the lowest layer is set to be at an optimal condition in the laminated semiconductor film.

In this embodiment, in order to increase the surface roughness accuracy of the B-α silicon film 4 at the lowest layer, the silicon seed layer 3 is formed on the surface of the underlying layer prior to the formation of the B-α silicon film 4. Specifically, a silicon is absorbed on the surface of the underlying layer so that the silicon seed layer 3 made of a non-doped silicon having a thin thickness of, e.g., an atomic layer level, is formed. In this embodiment, the film of the lowest layer, i.e., the B-α silicon film 4, is formed on the silicon seed layer 3.

As described above, the formation of the silicon seed layer 3 allows the B-α silicon film 4, although being likely to be polycrystallized, formed upward the underlying film, e.g., the silicon oxide film 2, in a good amorphous state and with a good surface roughness.

Accordingly, the surface roughness accuracy of the B-α silicon film 4 at the lowest layer (hereinafter sometimes referred to as a "first B-α silicon film 4") is further enhanced when compared with the case where the silicon seed layer 3 is not formed. Further, the B-α silicon film 4 is formed in the amorphous state so that the α silicon film 5 (i.e., a first α silicon film 5) to be formed on the first B-α silicon film 4 may be also formed in a good amorphous state. A second B-α silicon film 4 to be further laminated on the first α silicon film 5 may be likely to be polycrystallized depending on an underlying film. However, if this underlying film is the first α silicon film 5 having a good amorphous state, the second B-α silicon film 4 can be formed in the good amorphous state.

As described above, the silicon seed layer 3 is formed so that the surface roughness accuracy of the first B-α silicon film 4 at the lowest layer is further enhanced, which makes it possible to further increase surface roughness accuracies of the first α silicon film 5, the second B-α silicon film 4, a second a silicon film 5, . . . , which are being formed upward in order.

Further, it is desirable to form the silicon seed layer 3 with a thin thickness. To do this, the silane-based gas may be used as the absorption treatment gas for forming the silicon seed layer 3. An example of the silane-based gas may be as follows:

$SiH_4$, $Si_2H_6$,

Silicon Hydride represented by a chemical formula such as $Si_mH_{2m+2}$ (wherein, m is a natural number equal to or more than 3), Silicon Hydride represented by a chemical formula such as $Si_nH_{2n}$ (wherein, n is a natural number equal to or more than 3), and others.

Further, an example of the $Si_mH_{2m+2}$ may be as follows:

Trisilane $(Si_3H_8)$,

Tetrasilane $(Si_4H_{10})$,

Pentasilane $(Si_5H_{12})$,

Hexasilane $(Si_6H_{14})$,

Heptasilane $(Si_2H_{16})$, and others.

Further, an example of the $Si_nH_{2n}$ may be as follows:

Cyclotrisilane $(Si_3H_6)$,

Cyclotetrasilane $(Si_4H_8)$,

Cyclopentasilane $(Si_5H_{10})$,

Cyclohexasilane $(Si_6H_{12})$,

Cycloheptasilane $(Si_2H_{14})$, and others.

Further, since the silicon seed layer 3 may be formed with the thin thickness of, e.g., the atomic layer level. For example, the silane-based gas may be used, which has a very fast film forming rate. The use of such gas may result in worsening of a surface roughness or a step coverage when a film thickness increases. As such, a higher order silane-based gas than the silane-based gas, which is used as the raw material gas of the B-α silicon film 4 and the α silicon film 5, may be used as the silicon absorption treatment gas. Specifically, when the monosilane (SiH$_4$) is used as the raw material gas of the B-α silicon film 4 and the α silicon film 5, a disilane (Si$_2$H$_6$) may be used as the absorption treatment gas for forming the silicon seed layer 3. The disilane is the silicon raw material gas and is known as a material having a film forming rate higher than the monosilane.

Examples of the absorption treatment gas may include an aminosilane-based gas, in addition to the silane-based gas.

An example of the aminosilane-based gas may be as follows:

BAS (butylaminosilane),
BTBAS (bis(tertiary-butylamino)silane),
DMAS (dimethylaminosilane),
BDMAS (bisdimethylaminosilane),
TDMAS (tridimethylaminosilane),
DEAS (diethylaminosilane),
BDEAS (bisdiethylaminosilane),
DPAS (dipropylaminosilane),
DIPAS (diisopropylaminosilane), and others.

The formation of the silicon seed layer 3 using the aminosilane-based gas offers a first advantage that an incubation time of a film which is formed on the silicon seed layer 3 is shortened, thus facilitating a reduction in thickness of each film of the laminated semiconductor films. In the aforementioned embodiment, the reduction in thicknesses of the B-α silicon film 4 and the α silicon film 5 are facilitated. This provides the laminated semiconductor film having a more compact structure in a height direction, even if a plurality of the B-α silicon films 4 and a plurality of the α silicon films 5 are laminated.

A second advantage is that a film which is formed on the silicon seed layer 3 using the aminosilane-based gas instead of the silane-based gas has a good step coverage. For this reason, when the laminated semiconductor film is formed on a stepped underlying film, the aminosilane-based gas may be preferably employed as the absorption treatment gas for forming the silicon seed layer 3.

The features according to the third approach may be applied to the method of forming the laminated semiconductor film, but not limited thereto. For example, such features may be applied to a method of forming a semiconductor film as a single layer.

<First Embodiment of Film Forming Apparatus>

A first embodiment of a batch-type vertical film forming apparatus, which is capable of implementing the laminated semiconductor film forming method according to one embodiment, will be described.

Figure 5:
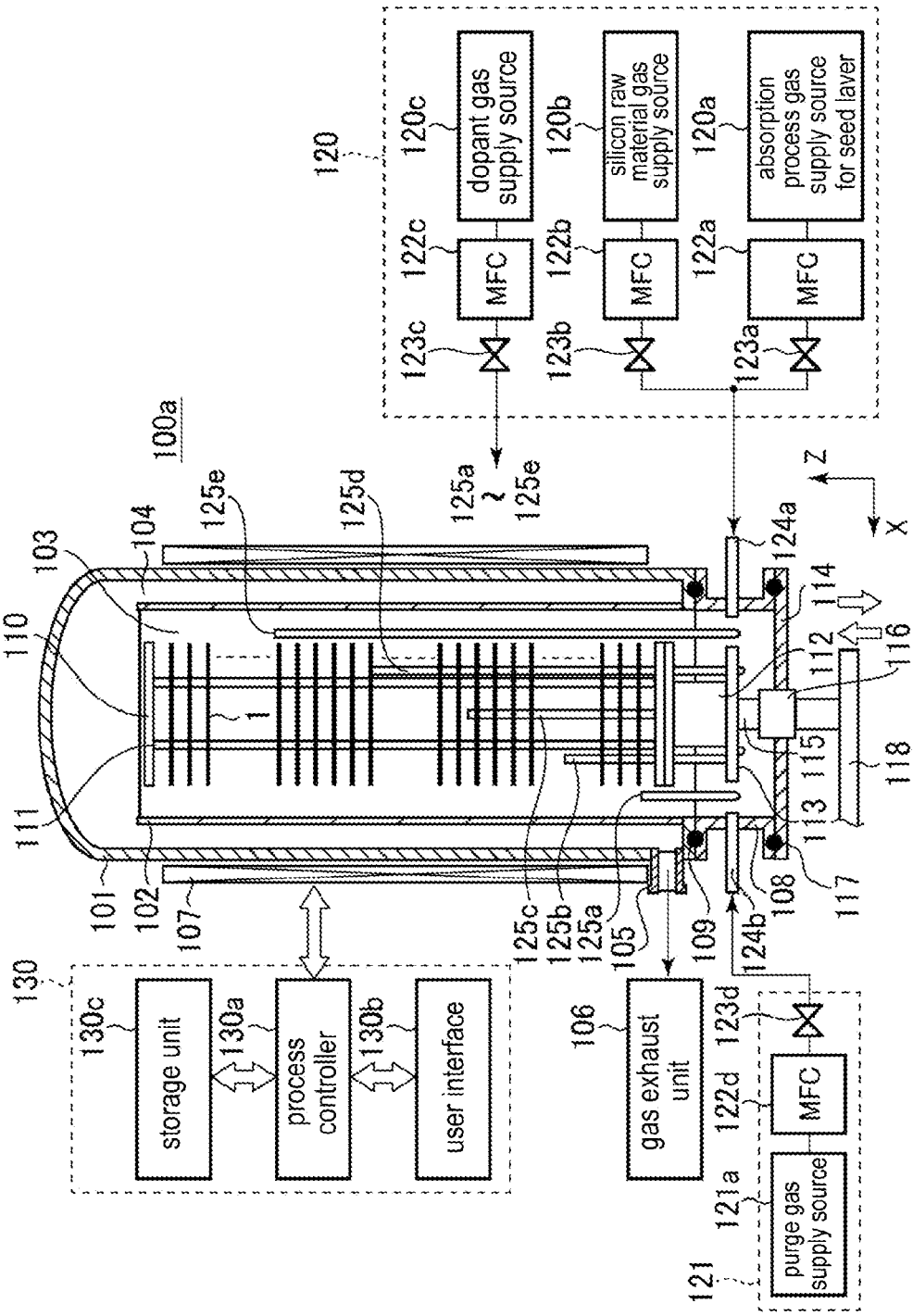
FIG. 5 is a longitudinal cross sectional view schematically showing a batch-type vertical film forming apparatus according to a first embodiment.

FIG. 5 is a longitudinal cross sectional view schematically showing a batch-type vertical film forming apparatus 100a according to the first embodiment.

As shown in FIG. 5, the batch-type vertical film forming apparatus (hereinafter simply referred to as a "film forming apparatus") 100a according to the first embodiment includes a cylindrical-shaped outer wall 101 having a ceiling and a cylindrical-shaped inner wall 102 provided inside the outer wall 101. The outer wall 101 and the inner wall 102 may be made of quartz. The inner side of the inner wall 102 constitutes a processing chamber 103 which is configured to receive substrates to be processed, e.g., a plurality of silicon substrates 1 in this embodiment, and perform a film forming process on the plurality of silicon substrates 1 received therein in batches. In the interior of the processing chamber 103, the laminated semiconductor film forming method according to the aforementioned embodiment is performed on the plurality of silicon substrates 1 in batches. The outer wall 101 and the inner wall 102 are separated from each other with an annular space 104 interposed therebetween along a horizontal direction X. Lower end portions of the outer wall 101 and the inner wall 102 are bonded with each other. An upper end portion of the inner wall 102 is spaced apart from the ceiling of the outer wall 101 such that an upper portion of the processing chamber 103 is in communication with the annular space 104. A portion being in communication with the upper portion of the processing chamber 103 in the annular space 104 acts as an exhaust path. Gas, which is supplied and diffused into the processing chamber 103, flows from the bottom to the top so that it is attracted into the annular space 104. An exhaust pipe 105 is connected to, e.g., a lower end portion of the annular space 104. The exhaust pipe 105 is connected with a gas exhaust unit 106. The gas exhaust unit 106 includes, e.g., a vacuum pump (not shown), and exhausts the gas used for processing from the interior of the processing chamber 103. Further, the gas exhaust unit 106 adjusts an internal pressure of the processing chamber 103 into a pressure suitable for processing.

A heating unit 107 is disposed outside the inner wall 102 to surround a periphery of the processing chamber 103. The heating unit 107 adjusts an internal temperature of the processing chamber 103 into a temperature suitable for processing and heats the substrates to be processed, e.g., the plurality of silicon substrates 1 in this embodiment.

Lower end portions of the outer wall 101 and the inner wall 102 are opened. A manifold 108 formed of, e.g., a stainless steel in a cylindrical shape, is connected to the opened portion through a seal member 109 such as an O ring. The manifold 108 supports the lower end portions of the outer wall 101 and the inner wall 102. A lower end portion of the manifold 108 is opened such that a boat 110 is inserted into the processing chamber 103 through the opened portion. The boat 110 is formed of, e.g., quartz, and includes a plurality of support pillars 111. Grooves (not shown) are formed in each of the plurality of support pillars 111 such that the plurality of substrates to be processed is supported by the grooves at once. With this configuration, the boat 110 is capable of mounting thereon the plurality of (e.g., 50 to 150) silicon substrates 1 as the substrates to be processed in multiple stages. The boat 110 on which the plurality of silicon substrates 1 are mounted is inserted into the processing chamber 103 so that the plurality of silicon substrates 1 are received within the processing chamber 103 where each of the plurality of silicon substrates 1 is subjected to the film forming process in batches.

The boat 110 is loaded on a table 113 through a heat insulating tube 112 made of quartz. The table 113 is supported by a rotation shaft 115 that passes through a cover part 114, for example, made of the stainless steel. The cover part 114 opens and closes the opened portion of the lower end portion of the manifold 108. A magnetic fluid seal 116 is disposed at a through portion of the cover part 114 to closely seal and rotatably support the rotation shaft 115. Further, a seal member 117 of, e.g., O-ring, is disposed between a peripheral portion of the cover part 114 and the lower end portion of the manifold 108 such that a sealability in the processing chamber 103 is maintained. The rotation shaft 115 is installed at a front end of an arm 118 that is supported by an ascending/descending instrument (not shown) such as a boat elevator. With this configuration, the boat 110, the cover part 114 and the like are ascended or descended integrally in a vertical direction Z such that they are inserted into or detached from the processing chamber 103.

The film forming apparatus 100a includes a process gas supply instrument 120 that supplies a process gas into the processing chamber 103 and a purge gas supply instrument 121 that supplies a purge gas into the processing chamber 103.

The process gas supply instrument 120 includes an absorption treatment gas supply source for seed layer 120a, a silicon raw material gas supply source 120b and a dopant gas supply source 120c. Examples of the absorption treatment gas, the silicon raw material gas and the dopant gas may include a disilane gas, a monosilane gas and a boron trichloride gas, respectively.

The absorption treatment gas supply source for seed layer 120a is connected to a gas supply hole 124a through a mass flow controller (MFC) 122a and an on-off valve 123a. The gas supply hole 124a is formed to penetrate through the sidewall of the manifold 108 inward along the horizontal direction X. The gas is supplied into the manifold 108 through the gas supply hole 124a, and subsequently, is diffused toward the interior of the processing chamber 103 positioned above the manifold 108.

The silicon raw material gas supply source 120b is connected to the gas supply hole 124a through a mass flow controller (MFC) 122b and an on-off valve 123b. With this configuration, in the course of forming the seed layer as illustrated in the operation S1 of FIG. 1, the absorption treatment gas for forming the seed layer is supplied into the manifold 108 through the gas supply hole 124a, and similarly, in the course of forming the first and second semiconductor films as illustrated in the operations S3 and S5 of FIG. 1, the silicon raw material gas is supplied into the manifold 108 the gas supply hole 124a.

The dopant gas supply source 120c is connected to gas supply nozzles 125a to 125e through a mass flow controller (MFC) 122c and an on-off valve 123c. The gas supply nozzles 125a to 125e are formed to penetrate through the sidewall of the manifold 108 inward along the horizontal direction X, bend upward within manifold 108, and extend in the vertical direction Z toward the interior of the processing chamber 103.

The purge gas supply instrument 121 according to this example includes the purge gas supply source 121a. An example of the purge gas may include the hydrogen gas.

The purge gas supply source 121a is connected to a gas supply hole 124b through a mass flow controller (MFC) 122d and an on-off valve 123d. Similar to the gas supply hole 124a, the gas supply hole 124b is formed to penetrate through the sidewall of the manifold 108 inward along the horizontal direction X. The gas is supplied into the manifold 108 through the gas supply hole 124b, and subsequently, is diffused toward the interior of the processing chamber 103 positioned above the manifold 108.

A control unit 130 is connected to the film forming apparatus 100a. The control unit 130 includes, for example, a process controller 130a incorporating a microprocessor (e.g., a computer) 130a therein. Each component of the film forming apparatus 100a is controlled by the process controller 130a. The process controller 130a is connected to a user interface 130b and a storage unit 130c.

The user interface 130b includes an input part such as a touch panel or a keyboard that enables an operator to input a command for managing the film forming apparatus 100a, and a display part such as a display that visualizes and displays an operation state of the film forming apparatus 100a.

The storage unit 130c stores process recipes which include control programs for realizing various processes to be executed in the film forming apparatus 100a under control of the process controller 130a, and programs for causing the components of the film forming apparatus 100a to perform their respective processes depending on their respective processing conditions. The process recipes are stored in a storage medium of the storage unit 130c. Examples of the storage medium may include a hard disk or a semiconductor memory, or a portable memory such as a CD-ROM, DVD, flash memory or the like. Alternatively, the process recipes may be appropriately transmitted from other external apparatuses via, e.g., their respective dedicated lines.

If necessary, any process recipe may be called from the storage unit 130c according to an instruction provided from the user interface 130b by the operator and then executed by the process controller 130a so that a desired process corresponding to the called process recipe can be performed in the film forming apparatus 100a under control of the process controller 130a. In this embodiment, the film forming apparatus 100a performs the processes of the laminated semiconductor film forming method illustrated in the aforementioned embodiment under the control of the process controller 130a.

Figure 6:
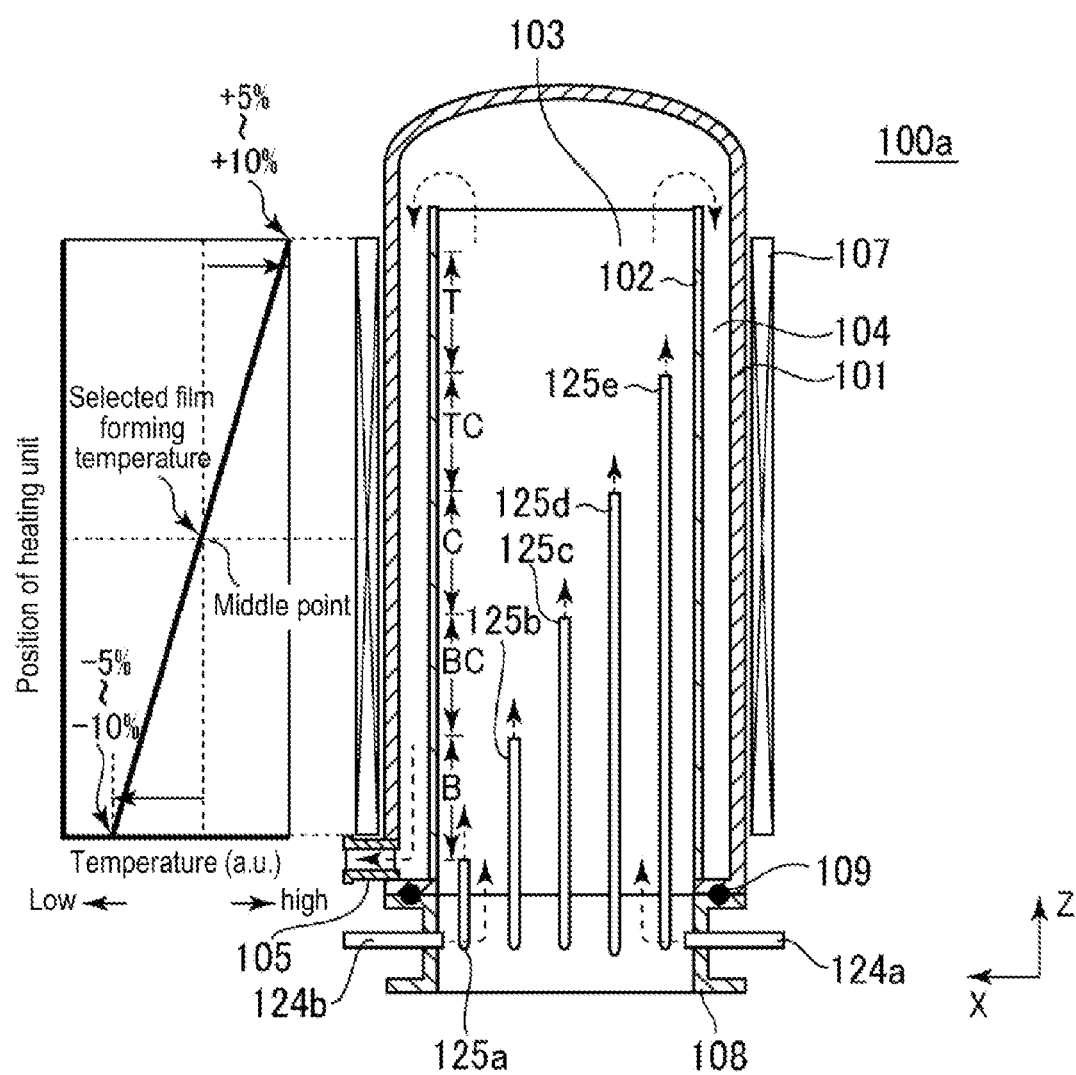
FIG. 6 is a longitudinal cross sectional view showing a state where a boat is extracted from the batch-type vertical film forming apparatus according to the first embodiment.

FIG. 6 is a longitudinal cross sectional view showing a state where the boat 110 is extracted from the film forming apparatus 100a according to the first embodiment. In FIG. 6, arrows indicated by a solid line represent a flow of gas, and the left side of FIG. 6 represents an example of a temperature gradient which is set in the heating unit 107.

As shown in FIG. 6, the interior of the processing chamber 103 of the film forming apparatus 100a is partitioned into a plurality of (e.g., five) zones, e.g., "B (bottom)", "BC (bottom center)", "C (center)", "TC (top center)" and "T (top)" in that order from the manifold 108 upward in this embodiment. Each of the gas supply nozzles 125a to 125e discharges a dopant gas toward a respective one of the five zones B, BC, C, TC and T. A gas discharging hole of each of the gas supply nozzles 125a to 125e is formed at an upper end thereof. The dopant gas is discharged from the upper end of each of the gas supply nozzles 125a to 125e upward along the vertical direction Z. In this configuration, the gas supply nozzles 125a to 125e have different heights. Specifically, the height of the gas supply nozzle 125a is set to just under the zone B, the height of the gas supply nozzle 125b is set to just under the zone BC, the height of the gas supply nozzle 125c is set to just under the zone C, the height of the gas supply nozzle 125d is set to just under the zone TC, and the height of the gas supply nozzle 125e is set to just under the zone T.

In other words, the interior of the processing chamber 103 is partitioned into the plurality of zones, and each of the gas supply nozzles 125a to 125e is disposed at a position corresponding to each of the plurality of zones such that the dopant gas is supplied into the processing chamber 103 through each of the gas supply nozzles 125a to 125e. With this configuration, it is possible to form a dopant-containing semiconductor films, e.g., the B-α silicon films 4 in this embodiment, from the silicon substrate 1 positioned at the lowest portion of the processing chamber 103 up to the silicon substrate 1 positioned at the uppermost portion of the processing chamber 103 while maintaining a uniform dopant concentration.

Further, the silicon raw material gas is supplied into the manifold 108 positioned below the processing chamber 103 through the gas supply hole 124a, and subsequently, is diffused upward within processing chamber 103. In this case, since the silicon raw material gas is being consumed as it goes upward within the processing chamber 103, a reaction of the film formation in the upper portion of the processing chamber 103 slows down compared with the lower portion thereof. Because of this, the film forming apparatus 100a according to the first embodiment uses the heating unit 107 which is capable of providing the temperature gradient within the processing chamber 103. Further, as shown in FIG. 6, the internal temperature of the processing chamber 103 is low at the lower portion and is gradually increased as it goes upward. Thus, the interior of the processing chamber 103 has a temperature distribution in which the internal temperature of the processing chamber 103 increases as it goes upward. With this configuration, it is possible to form the dopant-containing semiconductor film and a dopant-free semiconductor film, i.e., the B-α silicon film 4 and the α silicon film 5 in this embodiment, while maintaining a uniform film thickness from the silicon substrate 1 positioned at the lowest portion of the processing chamber 103 up to the silicon substrate 1 positioned at the uppermost portion of the processing chamber 103.

An example of the heating unit 107 which is capable of providing the temperature gradient within the processing chamber 103 may include a divisional-type heating unit which is constituted by dividing a built-in heater into a plurality of heating elements, wherein a temperature of each of the plurality of heating elements is individually controlled.

Further, after the temperature gradient is applied to the heating unit 107, it is not changed between a series of the operations S1 to S6. This reduces, for example, the process times required for the operations S2, S4 and S6.

As an example of the temperature gradient, when the film forming temperature is set to 500 degrees C., a temperature of the closest position to a location through which the silicon raw material gas is supplied may be set to 450 to 475 degrees C.; a temperature of the farthest position from the location may be set to 525 to 550 degrees C.; and a temperature of a middle position between the closest position and the farthest position may be set to 500 degrees C. For example, providing a temperature gradient off 5 to 10% with respect to the set film forming temperature over the zone B (i.e., the closest position) to the zone T (i.e., the farthest position) is useful to enhance a uniformity of a film thickness of each of the plurality of B-α silicon films 4 and the α silicon films 5.

<Second Embodiment of Film Forming Apparatus>

A second embodiment of a batch-type vertical film forming apparatus, which is capable of implementing the laminated semiconductor film forming method according to one embodiment, will be described.

Figure 7:
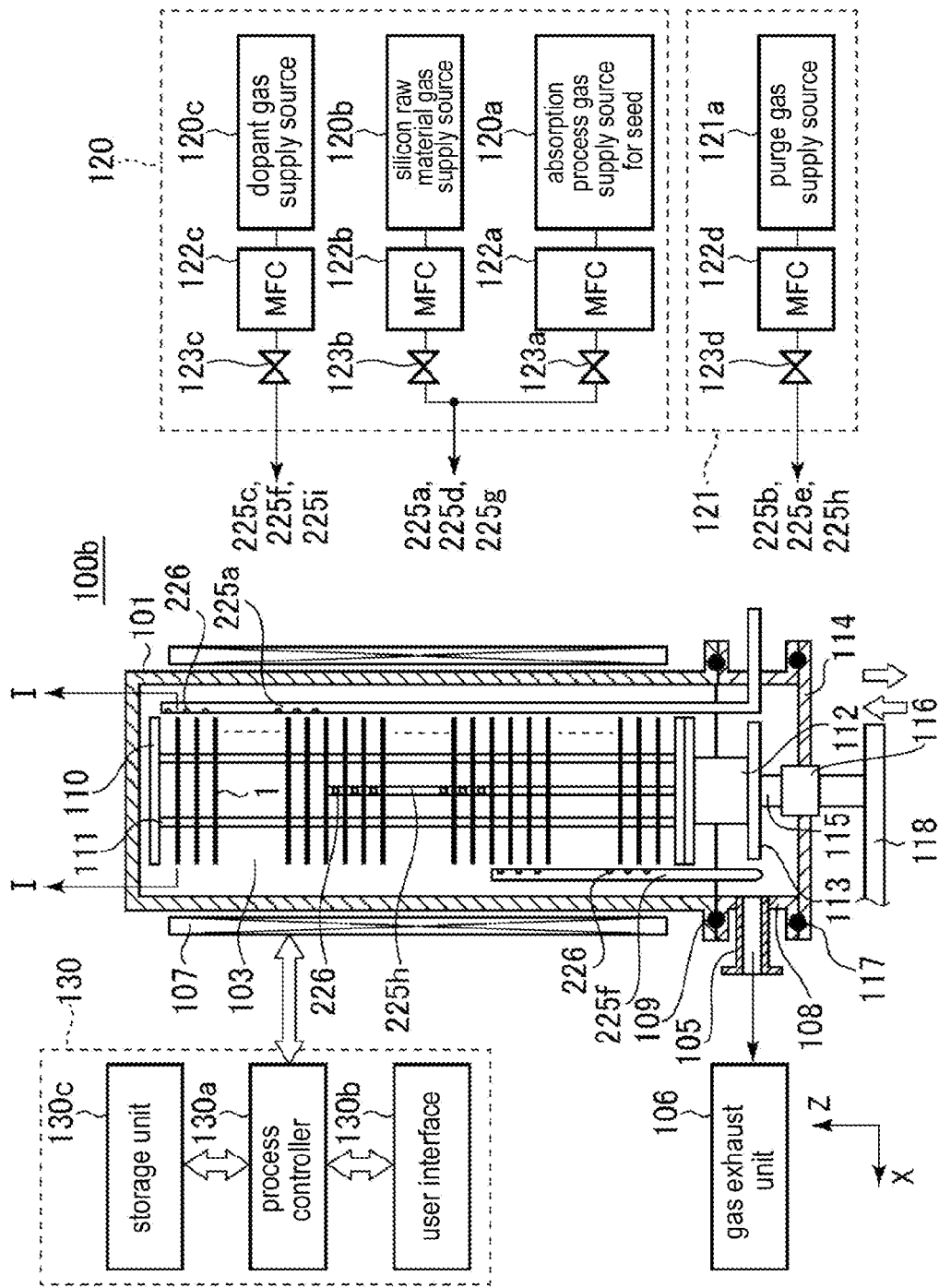
FIG. 7 is a longitudinal cross sectional view schematically showing a batch-type vertical film forming apparatus according to a second embodiment.

FIG. 7 is a longitudinal cross sectional view schematically showing the batch-type vertical film forming apparatus according to the second embodiment.

As shown in FIG. 7, the batch-type vertical film forming apparatus (hereinafter simply referred to as "film forming apparatus") 100b according to the second embodiment is different from the film forming apparatus 100a according to the first embodiment. By contrast to the first embodiment, according to the second embodiment, the gas supply nozzles 125a to 125e are replaced with a distributed gas supply nozzle 225, and the processing chamber 103 is defined by a region inside the outer wall 101 without forming the inner wall 102. Further, the exhaust pipe 105 is configured to penetrate through the sidewall of the manifold 108 inward along the horizontal direction X such that an exhaust is performed through the manifold 108 disposed at the lower portion of the processing chamber 103. In the second embodiment, the distributed gas supply nozzle 225 is formed to penetrate through the sidewall of the manifold 108 inward along the horizontal direction X, bend upward in the manifold 108, and extend to the interior of the processing chamber 103 along the vertical direction Z. In addition, the distributed gas supply nozzle 225 includes a plurality of gas discharge holes 226 through each of which gas is directly supplied to a surface to be processed of each of the plurality of substrates to be processed (e.g., the silicon substrates 1 in this embodiment) that are loaded into the processing chamber 103.

Figure 8:
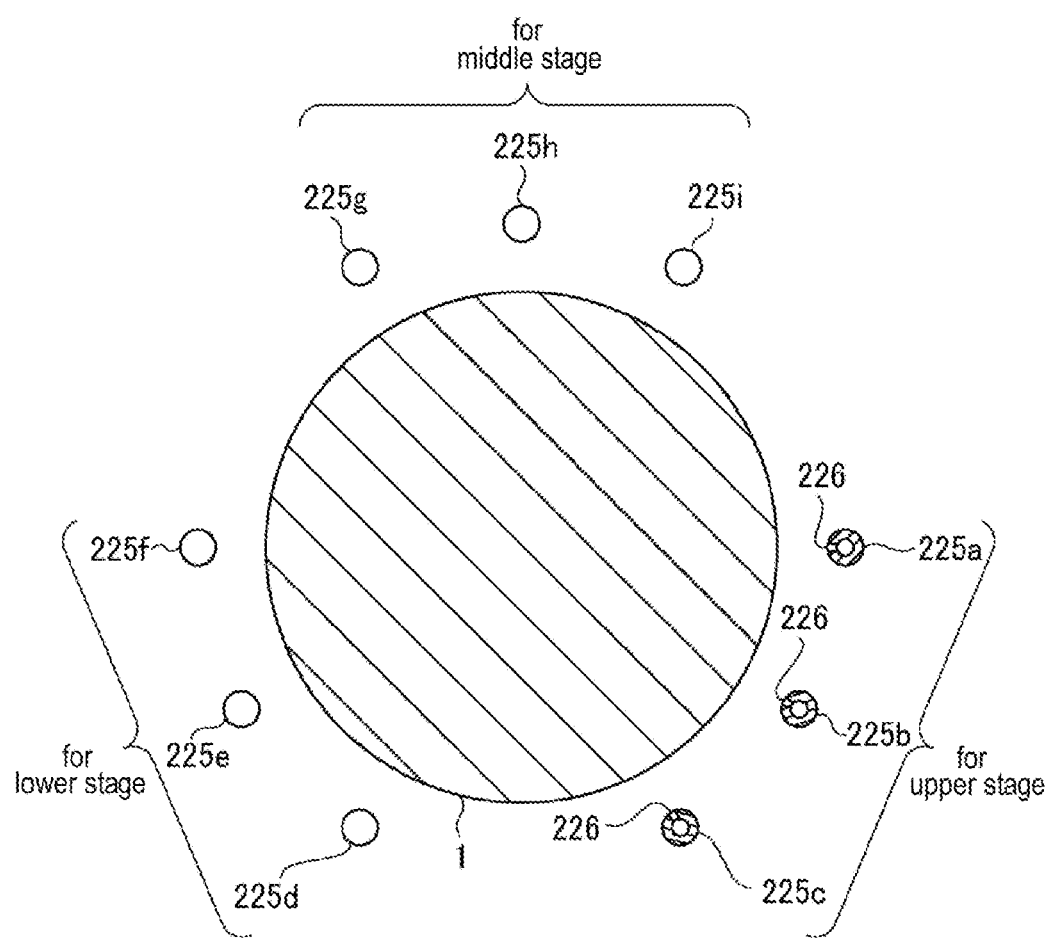
FIG. 8 is a horizontal cross sectional view taken along line I-I in FIG. 7.
Figure 9:
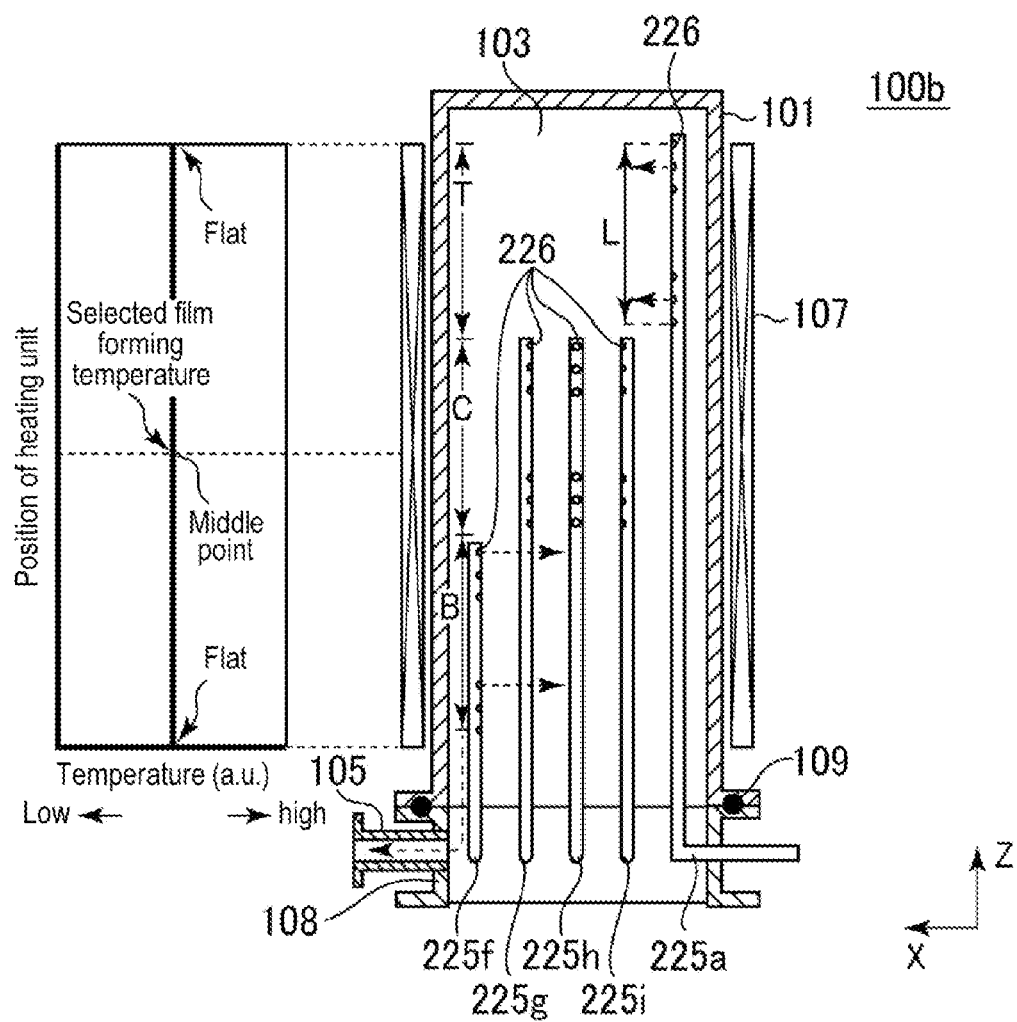
FIG. 9 is a longitudinal cross sectional view showing a state where a boat is extracted from the batch-type vertical film forming apparatus according to the second embodiment.

FIG. 8 is a horizontal cross sectional view taken along line I-I in FIG. 7, and FIG. 9 is a vertical cross sectional view showing a state where the boat 110 is extracted from the film forming apparatus 100b according to the second embodiment. In FIG. 9, arrows indicated by a solid line represent a flow of gas.

As shown in FIGS. 8 and 9, in some embodiments, the distributed gas supply nozzle 225 may include a plurality of (e.g., nine) distributed gas supply nozzles 225a to 225i, which are disposed inside the processing chamber 103.

The absorption treatment gas, e.g., the disilane gas in this embodiment, is supplied to the distributed gas supply nozzles 225a, 225d and 225g from the absorption treatment gas supply source for seed layer 120a through the mass flow controller (MFC) 122a and the on-off valve 123a. Further, the silicon raw material gas, e.g., the monosilane gas in this embodiment, is supplied to the distributed gas supply nozzles 225a, 225d and 225g from the silicon raw material gas supply source 120b through the mass flow controller (MFC) 122b and the on-off valve 123b, in addition the absorption treatment gas (see FIG. 7).

Further, the dopant gas, e.g., the boron trichloride gas in this embodiment, is supplied to the distributed gas supply nozzles 225c, 225f and 225i from the dopant gas supply source 120c through the mass flow controller (MFC) 122c and the on-off valve 123c (see FIG. 7).

Further, the purge gas, e.g., the hydrogen gas in this embodiment, is supplied to the distributed gas supply nozzles 225b, 225e and 225h from the purge gas supply source 121a through the mass flow controller (MFC) 122d and the on-off valve 123d (see FIG. 7).

In this manner, according to this embodiment, the absorption treatment gas, the silicon raw material gas and the purge gas are directly supplied to the surface to be processed of each of the plurality of substrates to be processed (e.g., the silicon substrates 1 in this embodiment) that are loaded into the processing chamber 103. In this embodiment, the absorption treatment gas, the silicon raw material gas and the purge gas are supplied to the surface to be processed of each of the plurality of silicon substrates 1 in parallel, i.e., along the horizontal direction X. These gases flow on each of the surfaces to be processed of the silicon substrates 1, followed by flowing toward the manifold 108 positioned under the processing chamber 103 along the vertical direction Z, and finally are exhausted through the exhaust pipe 105.

As described above, each of the absorption treatment gas, the silicon raw material gas and the purge gas is directly supplied to each of the surfaces to be processed of the silicon substrates 1, which makes it possible to form the dopant-containing semiconductor film and the dopant-free semiconductor film, e.g., the B-α silicon film 4 and the α silicon film 5 in this embodiment, while maintaining a uniform film thickness from the silicon substrate 1 positioned at the lowest portion of the processing chamber 103 up to the silicon substrate 1 positioned at the uppermost portion of the processing chamber 103.

Further, in the B-α silicon film 4, the concentration of dopant can be uniformly distributed over the silicon substrate 1 disposed at the lowest portion of the processing chamber 103 to the silicon substrate 1 disposed at the uppermost portion of the processing chamber 103. The left side in FIG. 9 represents a temperature distribution which is applied to the heating unit 107.

In the film forming apparatus 100b according to the second embodiment, since each of the absorption treatment gas, the silicon raw material gas and the purge gas is directly supplied to each of the surfaces to be processed of the silicon substrates 1, there is no need to apply the temperature gradient as the temperature distribution which has been applied to the heating unit 107 in the film forming apparatus 100a according to the first embodiment. Therefore, as shown in FIG. 9, it is possible to form the laminated semiconductor film by implementing a temperature distribution where a temperature of the heating unit 107 becomes flat throughout the whole thereof, and a constant temperature is distributed from a lower end portion of the manifold 108 to a portion of the ceiling of the processing chamber 103.

After the flat temperature distribution is implemented throughout the whole of the heating unit 107, there is no a change in temperature distribution between the series of the operations S1 to S6. This reduces the process times required for the operations S2, S4 and S6.

Moreover, in this embodiment, the interior of the processing chamber 103 of the film forming apparatus 100b is partitioned into a plurality of (e.g., three) zones such as "B (bottom)", "C (center)", and "T (top)" in that order upward from the manifold 108. The distributed gas supply nozzles 225a to 225i are divided into a first nozzle group for the zone T as a top stage (e.g., the distributed gas supply nozzles 225a to 225c), a second nozzle group for the zone B as a lower stage (e.g., the distributed gas supply nozzles 225d to 225f) and a third nozzle group for the zone C as a middle stage (e.g., the distributed gas supply nozzles 225g to 225i). This decreases the number of the gas discharge holes 226 to be formed on a respective distributed gas supply nozzle.

Further, in addition to the decrease in the number of the gas discharge holes 226, a length L of a portion where the gas discharge holes 226 are formed in the sidewall of the distributed gas supply nozzle 225 may be shortened. With this configuration, an amount of gas which is discharged from a position closest to a location at which gas is supplied, and an amount of gas which is discharged from a position farthest from the location can be substantially evenly controlled. With such further configuration, it is possible to form the B-α silicon film 4 and the α silicon film 5 while further maintaining a uniform film thickness from the silicon substrate 1 positioned at the lowest portion of the processing chamber 103 up to the silicon substrate 1 positioned at the uppermost portion of the processing chamber 103. Moreover, in the B-α silicon film 4, the concentration of dopant can be further evenly distributed throughout the silicon substrate 1 disposed at the lowest portion of the processing chamber 103 to the silicon substrate 1 disposed at the uppermost portion of the processing chamber 103.

While certain embodiments have been described, these embodiments have been presented by way of example only, and are not intended to limit the scope of the disclosures.

In the aforementioned example, the process temperatures of the operations S1 to S6 are set to be equal to each other and the temperatures between a series of the operations S1 to S6 are set to be constant. However, the operations S1 and S2 are performed only in the beginning of the film forming process and are further not repeated. Because of this, a temperature of the operation S1 or the temperatures of both the operations S1 and S2 may be changed into a temperature suitable to form the seed layer. In these cases, process temperatures of the operations S2 to S6 may be set to be equal to each other, and temperatures between a series of the operations S2 to S6 may be set to be constant. Alternatively, process temperatures of the operations S3 to S6 may be set to be equal to each other, and temperatures between a series of the operations S3 to S6 may be set to be constant.

In addition, in the above example, the silicon oxide film 2 has been described to be used as the underlying film, but is not limited thereto. For example, a silicon nitride film, a polycrystalline silicon film or a silicon substrate may be used as the underlying film. Alternatively, a metal film formed of metal such as tungsten (W), copper (Cu) or the like, which constitutes an internal wiring layer, may be used as the underlying film. Further alternatively, a dielectric film having a dielectric constant higher than that of the silicon oxide film, e.g., a tantalum oxide film, which is used as a dielectric film for a capacitor, may be used as the underlying film.

According to the present disclosure in some embodiments, it is possible to provide a laminated semiconductor film forming method, which is capable of maintaining or enhancing a good throughput, even if processes of forming different films are repeatedly performed.

Further, in some embodiments, it is possible to provide a laminated semiconductor film forming method, which is capable of maintaining a good surface roughness up to an upper layer, even if the series of processes of forming different films are repeatedly performed.

Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a laminated semiconductor film which is constituted by alternately laminating first and second semiconductor films on an underlying film of each of a plurality of substrates to be processed, the method comprising:
performing a first operation of forming the first semiconductor film and a second operation of forming the second semiconductor film until a predetermined number of laminated films are obtained,
wherein a film forming temperature in the first operation and a film forming temperature in the second operation are set to be equal to each other, and temperatures between the first and second operations are set to be constant,
wherein gas containing a material which is desorbed from the first and second semiconductor films during the formation thereof is employed as a purge gas to be used between the first and second operations, and
wherein when each of the first and second semiconductor films is a silicon film, the gas containing the material desorbed from the first and second semiconductor films is a hydrogen-containing gas.

2. The method of claim 1, wherein the film forming temperature is less than a crystallization temperature of the first and second semiconductor films.

3. A method of forming a laminated semiconductor film which is constituted by alternately laminating first and second semiconductor films on an underlying film of each of a plurality of substrates to be processed, the method comprising:
performing a first operation of forming the first semiconductor film and a second operation of forming the second semiconductor film until a predetermined number of laminated films are obtained,
wherein gas containing a material which is desorbed from the first and second semiconductor films during the formation thereof is employed as a purge gas to be used between the first and second operations, and
wherein when each of the first and second semiconductor films is a silicon film, the gas containing the material desorbed from the first and second semiconductor films is a hydrogen-containing gas.

4. A method of forming a laminated semiconductor film which is constituted by alternately laminating first and second semiconductor films on an underlying film of each of a plurality of substrates to be processed, the method comprising:
forming the laminated semiconductor film by performing a first operation of forming the first semiconductor film and a second operation of forming the second semiconductor film until a predetermined number of laminated films are obtained; and
forming a seed layer on the underlying film of the substrate to be processed prior to the formation of the laminated semiconductor film,
wherein each of the first and second semiconductor films is a silicon film, and
wherein the seed layer is formed by absorbing a silicon on a surface of the underlying film by using a higher order silane-based gas than a silane-based gas which is used as a raw material gas of the silicon film.

5. The method of claim 4, wherein each of the first and second semiconductor films is a silicon film, and
wherein the seed layer is formed by absorbing a silicon on a surface of the underlying film by using an aminosilane-based gas.

6. The method of claim 4, wherein a film forming temperature of the first operation and a film forming temperature of the second operation are set to be equal to each other, and temperatures between the first and second operations are set to be constant.

7. The method of claim 6, wherein a process temperature in the operation of forming the seed layer and the film forming temperature are set to be equal to each other, and
wherein temperatures between the operation of forming the seed layer and the first operation are set to be constant.

8. The method of claim 6, wherein the film forming temperature is set to be less than a crystallization temperature of the first and second semiconductor films.

9. The method of claim 4, wherein gas containing a material which is desorbed from the first and second semiconductor films during the formation thereof is employed as a purge gas to be used between the first and second operations and the operation of forming the seed layer.

10. The method of claim 9, wherein when each of the first and second semiconductor films is a silicon film, the gas containing the material desorbed from the first and second semiconductor films is a hydrogen-containing gas.

11. The method of claim 1, wherein one of the first and second semiconductor films is a doped semiconductor film which is doped with a dopant, and the other is a non-doped semiconductor film which is not doped with the dopant, and
wherein the gas containing the material desorbed from the first and second semiconductor films is further supplied in both an operation of forming the non-doped semiconductor film and an operation of forming the doped semiconductor film.

12. The method of claim 1, wherein one of the first and second semiconductor films is a doped semiconductor film which is doped with a dopant, and the other is a non-doped semiconductor film which is not doped with the dopant,
wherein the gas containing the material desorbed from the first and second semiconductor films is further supplied in an operation of forming the doped semiconductor film, and
wherein the gas containing the material desorbed from the first and second semiconductor films is further supplied from the middle of an operation of forming the non-doped semiconductor film.

13. The method of claim 1, wherein one of the first and second semiconductor films is a doped semiconductor film which is doped with a dopant, and the other is a non-doped semiconductor film which is not doped with the dopant,
wherein the plurality of substrates to be processed are loaded into a processing chamber of an apparatus of forming the laminated semiconductor film from one end portion toward the other end portion inside the processing chamber, and
wherein a raw material gas of the first and the second semiconductor film and a dopant gas to be applied to the first or the second semiconductor film are directly supplied to each of surface to be processed of the plurality of substrates to be processed which are loaded into the processing chamber.

14. The method of claim 9, wherein one of the first and second semiconductor films is a doped semiconductor film which is doped with a dopant, and the other is a non-doped semiconductor film which is not doped with the dopant, and
wherein the gas containing the material desorbed from the first and second semiconductor films is further supplied in both an operation of forming the non-doped semiconductor film and an operation of forming the doped semiconductor film.

15. The method of claim 9, wherein one of the first and second semiconductor films is a doped semiconductor film which is doped with a dopant, and the other is a non-doped semiconductor film which is not doped with the dopant,
wherein the gas containing the material desorbed from the first and second semiconductor films is further supplied in an operation of forming the doped semiconductor film, and
wherein the gas containing the material desorbed from the first and second semiconductor films is further supplied from the middle of an operation of forming the non-doped semiconductor film.

* * * * *